United States Patent
Ha et al.

(10) Patent No.: US 9,666,297 B1
(45) Date of Patent: May 30, 2017

(54) MEMORY DEVICE, MEMORY SYSTEM INCLUDING THE SAME AND OPERATION METHOD OF THE MEMORY SYSTEM

(71) Applicant: SK hynix Inc., Gyeonggi-do (KR)

(72) Inventors: Chang-Wan Ha, San Jose, CA (US); Sang-Hyun Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/208,222

(22) Filed: Jul. 12, 2016

(51) Int. Cl.
 *G11C 7/00* (2006.01)
 *G11C 16/30* (2006.01)

(52) U.S. Cl.
 CPC .................................. *G11C 16/30* (2013.01)

(58) Field of Classification Search
 CPC ..................................................... G11C 16/30
 USPC ........................................................ 365/226
 See application file for complete search history.

(56) References Cited

U.S. PATENT DOCUMENTS

2010/0246283 A1* 9/2010 Hirota ............... G11C 5/147
365/189.09

* cited by examiner

*Primary Examiner* — Hoai V Ho
(74) *Attorney, Agent, or Firm* — IP & T Group LLP

(57) ABSTRACT

A memory system includes: a first memory device including a first internal voltage generation circuit; and a second memory device including a second internal voltage generation circuit, wherein the first memory device and the second memory device receive an identical chip enable signal, and when the chip enable signal is disabled, the first internal voltage generation circuit and the second internal voltage generation circuit are controlled in a standby mode, and when the chip enable signal is enabled, the first internal voltage generation circuit and the second internal voltage generation circuit are independently controlled to have one mode between a weak active mode and a strong active mode.

10 Claims, 5 Drawing Sheets

MEMORY DEVICE, MEMORY SYSTEM INCLUDING THE SAME AND OPERATION METHOD OF THE MEMORY SYSTEM

BACKGROUND

1. Field

Exemplary embodiments of the present invention relate to a memory device, and a memory system including the memory device.

2. Description of the Related Art

Non-volatile memory devices are capable of electrically erasing data, programming new data and retaining the data even though power is turned off. Examples of non-volatile memory devices include flash memories and variable resistive memories. Flash memories are generally categorized in NOR flash memories and NAND flash memories. NOR flash memories have a structure where each memory cell is coupled with a bit line and a word line. This means that each memory cell can be accessed individually, hence NOR flash memories have excellent random access property.

NAND flash memories have a plurality of memory cells coupled in series in a structure known as a cell string. Each cell string has one common bit line contact for all the memory cells in the cell string. As a result, NAND flash memories have excellent integration degree. Because of their high integration degree, NAND flash memories are employed for storing data in diverse devices, such as, for example, mobile devices, various memory cards, solid-state drives (SSD) and so forth.

FIG. 1 illustrates a conventional semiconductor package 100 including a plurality of memory devices 110 and 120.

The memory devices 110 and 120 are mounted on the semiconductor package 100 providing increased storage capacity for the semiconductor package as compared to a semiconductor package having a single memory device. As illustrated in FIG. 1, the memory devices 110 and 120 share a chip enable signal CE.

The chip enable signal CE selects and activates a chip. When the chip enable signal CE is disabled, the memory devices 110 and 120 are in a standby mode consuming a little amount of current. When the chip enable signal CE is enabled, the memory devices 110 and 120 are in an active mode and consume more current.

Since the memory devices 110 and 120 share the chip enable signal CE, the memory devices 110 and 120 go into the active mode simultaneously upon enablement of the chip enable signal CE. However, as only one memory device is accessed at one time in the semiconductor package 100, the simultaneous activation of both of the memory devices 110 and 120 causes wasteful current consumption.

SUMMARY

One aspect of the present invention is directed to a memory system having reduced current consumption.

In accordance with an embodiment of the present invention, a memory system includes: a first memory device including a first internal voltage generation circuit; and a second memory device including a second internal voltage generation circuit, wherein the first memory device and the second memory device receive an identical chip enable signal, and when the chip enable signal is disabled, the first internal voltage generation circuit and the second internal voltage generation circuit are controlled in a standby mode, and when the chip enable signal is enabled, the first internal voltage generation circuit and the second internal voltage generation circuit are independently controlled to have one mode between a weak active mode and a strong active mode.

When the chip enable signal is enabled, the first internal voltage generation circuit and the second internal voltage generation circuit may be controlled in the weak active mode, and while the chip enable signal is enabled, the internal voltage generation circuit of the memory device that is selected to operate between the first memory device and the second memory device may be controlled in a strong active mode.

The memory device to operate may be selected between the first memory device and the second memory device based on a Logical Unit Number (LUN) address.

The first internal voltage generation circuit and the second internal voltage generation circuit may consume more current in the weak active mode than in the standby mode, and the first internal voltage generation circuit and the second internal voltage generation circuit may consume more current in the strong active mode than in the weak active mode.

Each of the first internal voltage generation circuit and the second internal voltage generation circuit may include a plurality of internal voltage generators for generating the internal voltage, and in the standby mode, a first number of internal voltage generators among the internal voltage generators may be enabled, and in the weak active mode, a second number of internal voltage generators among the Internal voltage generators may be enabled, where the second number is greater than the first number, and in the strong active mode, a third number of internal voltage generators among the internal voltage generators may be enabled, where the third number is greater than the second number.

Each of the first internal voltage generation circuit and the second internal voltage generation circuit may include: a standby internal voltage generator that is enabled in the standby mode and generate the internal voltage; a weak active internal voltage generator that is enabled in the weak active mode and generate the internal voltage in a stronger intensity than the standby internal voltage generator; and a strong active internal voltage generator that is enabled in the strong active mode and generate the internal voltage in a stronger intensity than the weak active internal voltage generator.

In accordance with another embodiment of the present invention, a method for operating a memory system including a first memory device and a second memory device that share a chip enable signal, which includes: controlling the first memory device and the second memory device in a standby mode in a duration where the chip enable signal is disabled; controlling the first memory device and the second memory device in a weak active mode when the chip enable signal is enabled; and controlling the memory device that is selected to operate between the first memory device and the second memory device in a strong active mode, while the chip enable signal is enabled.

The first memory device and the second memory device may consume more current to generate an internal voltage in the weak active mode than in the standby mode; and the first memory device and the second memory device may consume more current to generate the internal voltage in the strong active mode than in the weak active mode.

The first memory device and the second memory device may generate the internal voltage in a stronger intensity in the weak active mode than in the standby mode; and the first memory device and the second memory device may generate the internal voltage in a stronger intensity in the strong active mode than in the weak active mode.

The memory device to operate may be selected between the first memory device and the second memory device based on a Logical Unit Number (LUN) address.

In accordance with yet another embodiment of the present Invention, a memory device includes: an internal voltage generation circuit that generates an internal voltage whose intensity is controlled according to a mode; and a mode control circuit that controls the internal voltage generation circuit in one mode among a standby mode, a weak active mode, and a strong active mode based on a chip enable signal and a Logical Unit Number (LUN) address.

The mode control circuit may control the internal voltage generation circuit in a standby mode when the chip enable signal is disabled, control the internal voltage generation circuit in the weak active mode when the chip enable signal is enabled and the LUN address says that the memory device is not selected, or control the internal voltage generation circuit in the strong active mode when the chip enable signal is enabled and the LUN address says that the memory device is selected.

The internal voltage generation circuit may include a plurality of internal voltage generators for generating the internal voltage, and a first number of internal voltage generators among the internal voltage generators may be enabled in the standby mode, and a second number of internal voltage generators among the internal voltage generators may be enabled in the weak active mode, where the second number is greater than the first number, and a third number of internal voltage generators among the Internal voltage generators may be enabled in the strong active mode, where the third number is greater than the second number.

The Internal voltage generation circuit may include: a standby internal voltage generator that is enabled in the standby mode and generate the internal voltage; a weak active internal voltage generator that is enabled in the weak active mode and generate the internal voltage in a stronger intensity than the standby internal voltage generator; and a strong active internal voltage generator that is enabled in the strong active mode and generate the Internal voltage in a stronger intensity than the weak active internal voltage generator.

DETAILED DESCRIPTION

Figure 1:
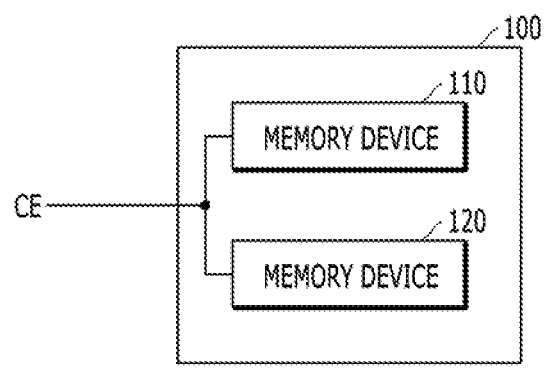
FIG. 1 illustrates a conventional semiconductor package including a plurality of memory devices wherein two memory devices share a common chip enable signal.

Various embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

Figure 2:
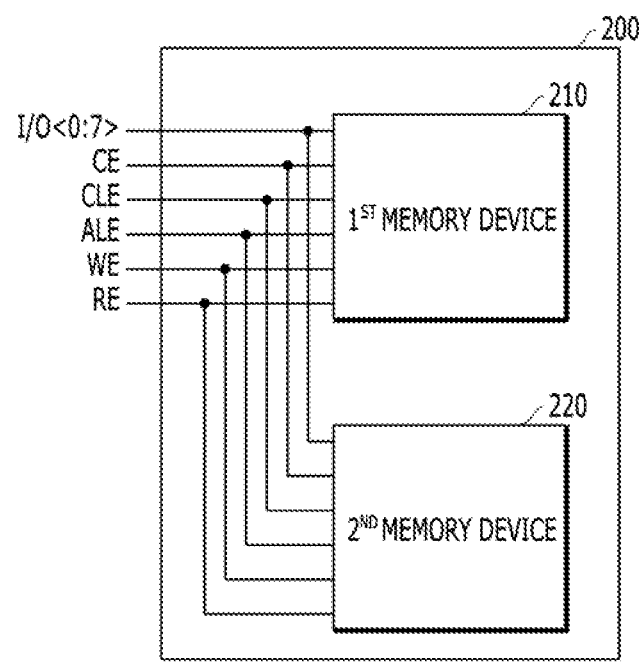
FIG. 2 illustrates a memory system, according to an embodiment of the present invention.

Referring now to FIG. 2 a memory system 200 is provided, according to an embodiment of the present invention.

According to the embodiment of FIG. 2, the memory system 200 may include a first memory device 210 and a second memory device 220.

It is noted that although FIG. 2 illustrates only two memory devices as an example, the memory system 200 may include two or more memory devices. In an embodiment, the memory system 200 may be a single semiconductor package that includes two or more memory devices. In another embodiment, the memory system 200 may be a printed circuit board (PCB) having two or more memory devices mounted thereon.

Referring to the embodiment illustrated in FIG. 2, the first and second memory devices 210 and 220 may share a plurality of input/output buses I/O<0:7> and control signals CE, CLE, ALE, WE and RE. Through the input/output buses I/O<0:7>, at least one of a command, an address, and a program data_may be inputted into the first and second memory devices 210 and 220. The command may be at least one of a read, write ("program") and erase command. The command may also be a command for performing a background operation on the memory devices. The first and second memory devices 210 and 220 may output a read data through the input/output buses I/O<0:7>.

The control signals CE, CLE, ALE, WE and RE may be as follows. A chip enable signal CE may be a signal for enabling a corresponding memory device, e.g. the first and/or the second memory device 210 and 220 as needed. The memory devices 210 and 220 may be enabled separately. A command latch enable signal CLE may be a signal for informing that a signal inputted through the input/output buses I/O<0:7> is a command. An address latch enable signal ALE may be a signal for informing that a signal inputted through the input/output buses I/O<0:7> is an address. A write enable signal WE may be an input synchronization signal for strobing a signal that is inputted to the first and second memory devices 210 and 220 through the input/output buses I/O<0:7>. A read enable signal RE may be an output synchronization signal for strobing a signal that is outputted from the first and second memory devices 210 and 220 through the input/output buses I/O<0:7>.

While the chip enable signal CE is disabled to a logic high level, the first and second memory devices 210 and 220 may both be in a standby mode to minimize current consumption. While the chip enable signal CE is enabled to a logic low level, the first and second memory devices 210 and 220 may be independently controlled to go to one of a weak active mode and a strong active mode. One of the first and second memory devices 210 and 220 may be selected to transition to a strong active mode while the other one (the unselected one) may transition in a weak active mode. The memory devices consume more current in the weak active mode than in the standby mode. The memory devices consume more current in the strong active mode than in the weak active mode.

Figure 3:
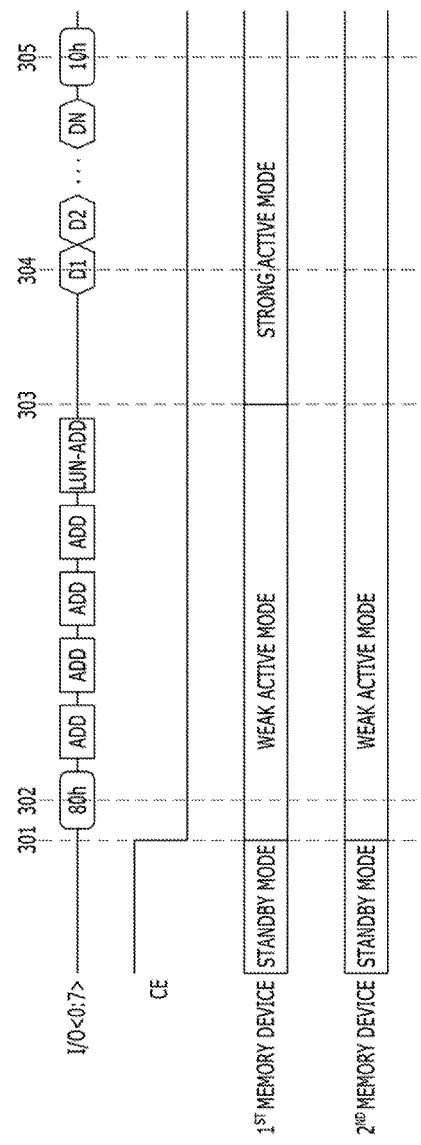
FIG. 3 is a timing diagram illustrating an operation of the memory system of FIG. 2.

FIG. 3 is a timing diagram illustrating an operation of the memory system 200 of FIG. 2, according to an embodiment of the present invention.

According to the embodiment of FIG. 3, while the chip enable signal CE is disabled to a logic high level, the first and second memory devices 210 and 220 may stay in the standby mode.

When the chip enable signal CE is enabled to a logic low level at a moment 301, the first and second memory devices 210 and 220 may switch in a weak active mode from a standby mode, in response to the enabling of the chip enable signal CE.

A command may be applied at a moment 302 through the input/output buses I/O<0:7>. FIG. 3 shows an example where a program command 80h is applied at time 302. An address ADD may be inputted during five cycles following the program command 80h. Among the addresses ADD, a logical unit number address LUN-ADD, which is inputted at the fifth cycle, may be an address for selecting one between the first and second memory devices 210 and 220 to perform a program operation.

At a moment 303 after input of the LUN address LUN-ADD, the selected memory device according to the LUN address LUN-ADD, e.g., the first memory device 210 as illustrated in FIG. 3, may switch in a strong active mode. Hence, FIG. 3 shows the first memory device 210 is selected and switches to a strong active mode according to the LUN address LUN-ADD, however it is noted that this only an example. In another example (not shown), the second memory device 220 may be selected to switch to a strong active mode according to the LUN address LUN-ADD. In an embodiment wherein more than two memory devices are employed (not shown), any of the memory devices may be selected at time 303 to switch to a strong active mode according to the LUN address LUN-ADD.

At a moment 304, program data D0 to DN may start to be applied through the input/output buses I/O<0:7>. Since the first memory device 210 is selected to perform a program operation according to the LUN address LUN-ADD, the program data D0 to DN may be programmed in the selected first memory device 210 in the strong active mode. Likewise, in another example if the second memory device was selected and switched to the strong active mode at time 303 then the program data D0 to DN may be programmed in the second memory device in the strong active mode. In another embodiment, wherein more than two memory devices are employed then the program data D0 to DN may be programmed in the memory device which was selected and switched to the strong active mode at time 303.

At a moment 305, a command 10h informing completion of the input of the program data D0 to DN may be applied to the memory device which was selected at time 303, e.g., to the first memory device 210 according to the example illustrated in FIG. 3. Hence, FIG. 3, illustrates as an example, a program operation for programming program data D0 to DN performed in the first memory device 210.

When the chip enable signal CE is disabled back to the logic high level, the first and second memory devices 210 and 220 switch back to the standby mode again (not shown).

As shown in FIG. 3, when the chip enable signal CE is enabled to a logic low level, the first and second memory devices 210 and 220 may go into a weak active mode in which more current is consumed than in the standby mode. While the first and second memory devices 210 and 220 stay in the weak active mode, they may receive a command for performing an operation and an address to get ready for a decoding operation. Then, the selected one between the first and second memory devices 210 and 220 according to the LUN address LUN-ADD may switch in a strong active mode wherein it consumes a sufficient amount of current to perform the requested operation.

Figure 4:
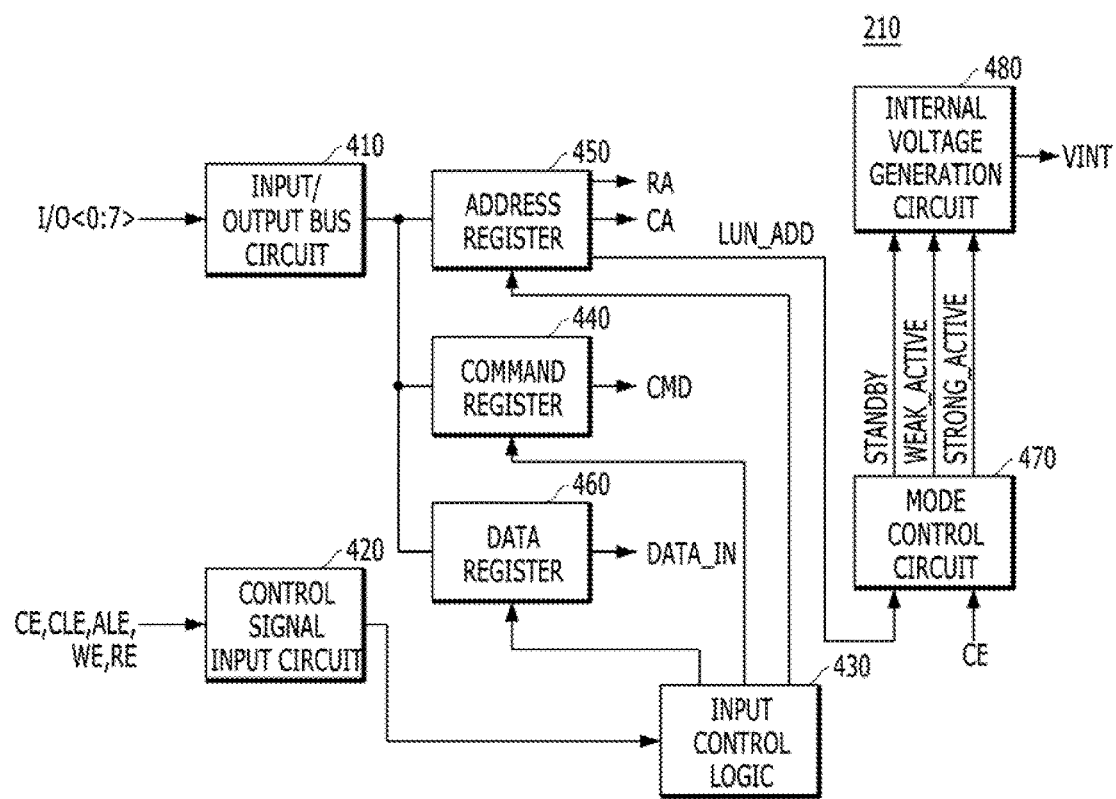
FIG. 4 is a block diagram describing a configuration of the first memory device of FIG. 2, according to an embodiment of the present invention.

FIG. 4 is a block diagram describing a configuration for the first memory device 210 of FIG. 2, according to an embodiment of the present invention. The second memory device 220 may have the same configuration as the first memory device 210.

According to the embodiment of FIG. 4, the first memory device 210 may include an input/output bus circuit 410, a control signal input circuit 420, an input control logic 430, a command register 440, an address register 450, a data register 460, a mode control circuit 470, and an Internal voltage generation circuit 480.

The input/output bus circuit 410 may receive one or more signals inputted through the input/output buses I/O<0:7>. For example, the input/output buses I/O<0:7> includes eight lines and the input/output bus circuit 410 may include eight Input buffers. It is noted that the number of input/output buses and the corresponding buffers in the input/output bus circuit may vary. The control signal input circuit 420 may receive the control signals CE, CLE, ALE, WE and RE. For example, the control signals are five the control signal input circuit 420 may also include five input buffers.

The Input control logic 430 may control the command register 440, the address register 450, and the data register 460 based on the control signals CE, CLE, ALE, WE and RE. With the control signals CE, CLE, ALE, WE and RE, it is possible to identify what kind of signals are inputted through the input/output buses I/O<0:7>. For example, when a command is inputted through the input/output buses I/O<0:7>, the input control logic 430 transmits the CLE signal received from the control signal input circuit to the command register 440 to enable the command register 440 so that the command inputted through the input/output buses I/O<0:7> may be latched to the command register 440. When an address is inputted through the input/output buses I/O<0:7>, the input control logic 430 transmits the ALE signal received from the control signal input circuit 420 to the address register 450 to enable the address register 450 so that the address inputted through the input/output buses I/O<0:7> may be latched to the address register 450. When data are inputted through the input/output buses I/O<0:7>, the input control logic 430 enables the data register 460 so that the data inputted through the input/output buses I/O<0:7> may be latched to the data register 460. In the drawing, 'CMD' represents the command latched to the command register 440, 'RA' represents a row address latched to the address register 450, and 'CA' represents a column address latched to the address register 450. Also, 'LUN-ADD' represents the logical unit number (LUN) address LUN-ADD latched to the address register 450, and 'DATA_IN' represents input data that are latched to the data register 460.

The mode control circuit 470 may control the standby mode and the weak and strong active modes based on the chip enable signal CE and the LUN address LUN-ADD. The mode control circuit 470 may enable a standby mode signal STANDBY while the chip enable signal CE is disabled to a logic high level. While the chip enable signal CE is enabled to a logic low level, the mode control circuit 470 enables a weak active mode signal WEAK_ACTIVE when the LUN address LUN-ADD represents non-selection of the first memory device 210. When the LUN address LUN-ADD represents selection of the first memory device 210 while the chip enable signal CE is enabled, the mode control circuit 470 enables a strong active mode signal STRONG_ACTIVE.

The internal voltage generation circuit 480 may generate an internal voltage VINT to be employed in the first memory device 210. The Internal voltage generation circuit 480 may control the drivability of the internal voltage VINT based on the mode signals STANDBY, WEAK_ACTIVE and STRONG_ACTIVE. The internal voltage generation circuit 480 may generate the internal voltage VINT of a low drivability in the standby mode by using a small amount of current, generate the internal voltage VINT of a middle drivability in the weak active mode by using more current than that in the standby mode, and generate the internal voltage VINT of a high drivability in the strong active mode by using much current. As the internal voltage generation circuit 480 generates the internal voltage VINT of higher drivability, the circuits inside of the first memory device 210 using the internal voltage VINT may operate using a more sufficient amount of current.

Figure 5:
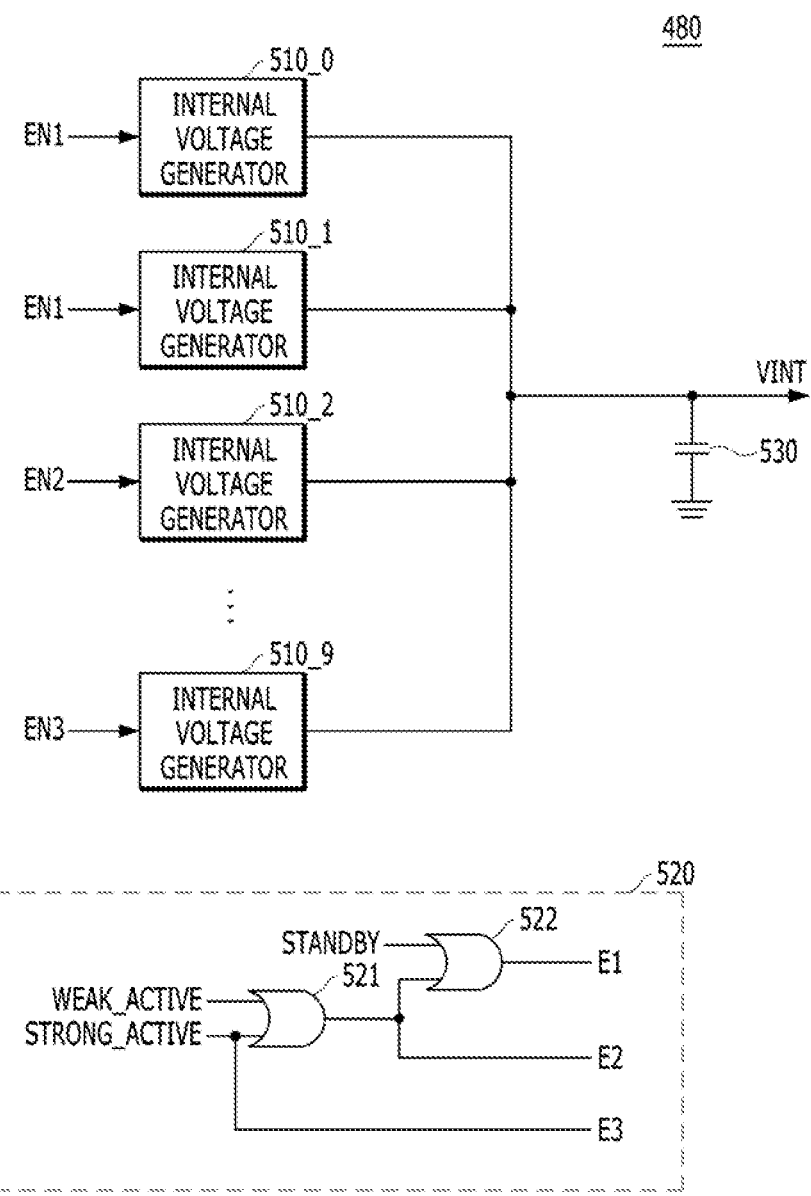
FIG. 5 is a block diagram describing an internal voltage generation circuit of FIG. 4, according to an embodiment of the present invention.

FIG. 5 is a block diagram describing a configuration for the internal voltage generation circuit 480 of FIG. 4, according to an embodiment of the present invention.

According to the embodiment of FIG. 5, the internal voltage generation circuit 480 may include a plurality of internal voltage generators 510_0 to 510_9, an enable controller 520, and a capacitor 530.

Each of the internal voltage generators 510_0 to 510_9 may control the internal voltage VINT. The internal voltage generators 510_0 to 510_9 may generate the internal voltage VINT based on a charge pumping scheme or a voltage dividing scheme. For example, the first two internal voltage generators 510_0 and 510_1 may be enabled in response to a first enable signal EN1, and the next three internal voltage generators 510_2 to 510_4 may be enabled in response to a second enable signal EN2 while the next five internal voltage generators 510_5 to 510_9 may be enabled in response to a third enable signal EN3.

The capacitor 530 may be employed for stabilizing the level of the internal voltage VINT generated by the internal voltage generators 510_0 to 510_9.

The enable controller 520 may generate the first to third enable signals EN1 to EN3 in response to the standby mode signal STANDBY, the weak active mode signal WEAK_ACTIVE, and the strong active mode signal STRONG_ACTIVE. The enable controller 520 may enable the first enable signal EN1 when the standby mode signal STANDBY is enabled, enable the first and second enable signals EN1 and EN2 when the weak active mode signal WEAK_ACTIVE is enabled, and enable the first to third enable signals EN1 to EN3 when the strong active mode signal STRONG_ACTIVE is enabled. The enable controller 520 may include OR gates 521 and 522.

Since only two internal voltage generators 510_0 to 510_1 are enabled in the standby mode, the internal voltage VINT is not generated with a strong drivability and hence current consumption is the lowest in the standby mode as compared to the low active and strong active modes. Since five internal voltage generators 510_0 to 510_4 are enabled in the weak active mode, the internal voltage VINT is generated with a middle drivability which is higher than in the standby mode, hence more current is consumed than in the standby mode but lower than the strong active mode. Since all 10 internal voltage generators 510_0 to 510_9 are enabled in the strong active mode, the internal voltage VINT is generated with the highest drivability among the three modes (i.e., the standby, weak active and strong active modes) and, hence, current consumption is higher than the low active mode. Current consumption for the strong active mode is the highest among the three modes. Hence, according to the present invention the internal voltage generation circuit 480 I controlled to generate the internal voltage VINT having an appropriate drivability corresponding to one of three modes of operation of the memory devices, thus resulting in a more efficient current consumption and preventing waste of current.

Although FIG. 5 shows an example where the internal voltage generation circuit 480 includes 10 internal voltage generators 510_0 to 510_9 and two, five or 10 internal voltage generators 510_0 to 510_9 are enabled according to the mode, it is obvious to those skilled in the art that the total number of the internal voltage generators and the number of the internal voltage generators enabled according to each mode may be varied.

Figure 6:
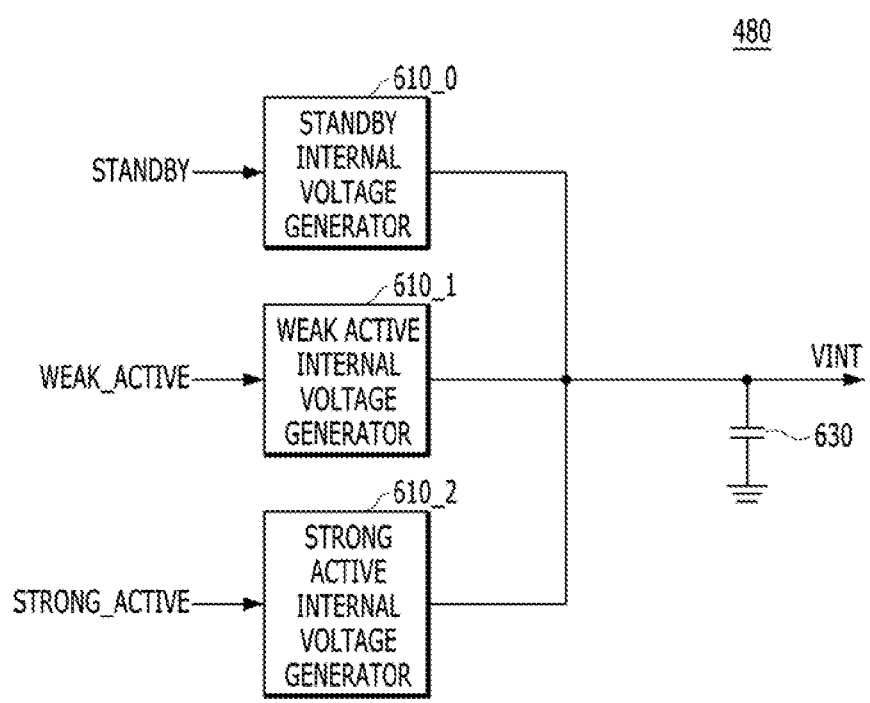
FIG. 6 is a block diagram describing the internal voltage generation circuit of FIG. 4, according to another embodiment of the present invention.

FIG. 6 is a block diagram describing a configuration for the internal voltage generation circuit 480 of FIG. 4, according to another embodiment of the present invention.

According to the embodiment of FIG. 6, the internal voltage generation circuit 480 may include a standby internal voltage generator 610_0, a weak active internal voltage generator 610_1, a strong active internal voltage generator 610_2, and a capacitor 630.

The standby internal voltage generator 610_0 may be enabled when the standby mode signal STANDBY is enabled and generate an internal voltage VINT. The standby internal voltage generator 610_0 may generate the internal voltage VINT based on a charge pumping scheme or a voltage dividing scheme. The standby internal voltage generator 610_0 may consume a small amount of current and supply the internal voltage VINT having a low drivability, i.e., the lowest among the three modes of operation of the memory devices. For example, when the standby internal voltage generator 610_0 generates the internal voltage VINT in the charge pumping scheme, the capacitance of the capacitors for charge pumping may be small. When the standby internal voltage generator 610_0 generates the internal voltage VINT in the voltage dividing scheme, the resistance of the resistors for voltage division may be great.

The weak active internal voltage generator 610_1 may be enabled when the weak active mode signal WEAK_ACTIVE is enabled and generate an internal voltage VINT. The weak active internal voltage generator 610_1 may generate the internal voltage VINT in the same way as the standby internal voltage generator 610_0. The weak active internal voltage generator 610_1 may consume more current than the standby internal voltage generator 610_0 and supply the internal voltage VINT with a middle drivability which is higher than the standby internal voltage generator 610_0. For example, when the weak active internal voltage generator 610_1 generates the internal voltage VINT in the charge pumping scheme, the capacitance of the capacitors for charge pumping may be greater than that of the standby internal voltage generator 610_0. When the weak active internal voltage generator 610_1 generates the internal voltage VINT in the voltage dividing scheme, the resistance of the resistors for voltage division may be smaller than that of the standby internal voltage generator 610_0.

The strong active internal voltage generator 610_2 may be enabled when the strong active mode signal STRONG_ACTIVE is enabled and generate an internal voltage VINT. The strong active internal voltage generator 610_2 may generate the internal voltage VINT in the same way as the standby internal voltage generator 610_0. The strong active internal voltage generator 610_2 may consume the highest amount of current among the three modes of operation of the memory devices and supply the internal voltage VINT with the highest drivability among the three modes (i.e., the standby, weak active and strong active modes). For example, when the strong active internal voltage generator 610_2 generates the Internal voltage VINT in the charge pumping scheme, the capacitance of the capacitors for charge pumping may be greatest. When the strong active internal voltage generator 610_2 generates the Internal voltage VINT in the voltage dividing scheme, the resistance of the resistors for voltage division may be smallest.

The capacitor 630 may be employed to keep stable the level of the internal voltage VINT.

The internal voltage generation circuit 480 may include a plurality of internal voltage generators 610_0, 610_1 and 610_2 that have different amounts of current consumption and different internal voltage generation capability, and generate an internal voltage VINT by enabling the internal voltage generators according to the mode. In other words, the internal voltage generation circuit 480 generates the internal voltage VINT with an appropriate drivability according to the mode of operation and consumes an appropriate amount of current thus reducing the overall current consumption requirements for the memory system.

According to embodiments of the present invention, a memory system is provided having reduced power consumption than existing memory systems.

While the present invention has been described with respect to the specific embodiments, it will be apparent to those skilled in the art that various changes and modifications may be made without departing from the spirit and scope of the invention as defined in the following claims.

What is claimed is:

1. A memory system, comprising:
a first memory device including a first internal voltage generation circuit; and
a second memory device including a second internal voltage generation circuit,
wherein the first memory device and the second memory device are controlled through a common chip enable signal, and
when the chip enable signal is disabled, the first and second internal voltage generation circuits are in a standby mode, and
when the chip enable signal is enabled, the first and second internal voltage generation circuits independently switch to one of a weak active mode and a strong active mode.

2. The memory system of claim 1,
wherein when the chip enable signal is enabled, the first and second internal voltage generation circuits switch to the weak active mode, and
wherein, while the chip enable signal is enabled, one of the first and second internal voltage generation circuits of a selected one of the first and second memory devices switches to the strong active mode.

3. The memory system of claim 2, wherein the memory system selects one of the first and second memory devices based on a logical unit number (LUN) address.

4. The memory system of claim 2,
wherein the first and second internal voltage generation circuits consume more current in the weak active mode than in the standby mode, and
wherein the first and second internal voltage generation circuits consume more current in the strong active mode than in the weak active mode.

5. The memory system of claim 2,
wherein each of the first and second internal voltage generation circuits includes a plurality of internal voltage generators for generating the internal voltage,
wherein, in the standby mode, a first number of internal voltage generators are enabled,
wherein, in the weak active mode, a second number of voltage generators are enabled, where the second number is greater than the first number, and
wherein, in the strong active mode, a third number of internal voltage generators are enabled, where the third number is greater than the second number.

6. The memory system of claim 2, wherein each of the first and second internal voltage generation circuits includes:

a standby internal voltage generator suitable for generating the internal voltage of a low drivability in the standby mode;

a weak active internal voltage generator suitable for generating the internal voltage of a middle drivability in the weak active mode; and a strong active internal voltage generator suitable for generating the internal voltage of a high drivability in the strong active mode.

7. A method for operating a memory system including first and second memory devices that share a chip enable signal, comprising:

controlling the first and second memory devices in a standby mode while the chip enable signal is disabled;

controlling the first and second memory devices in a weak active mode while the chip enable signal is enabled; and selecting and controlling one of the first and second memory devices in a strong active mode while the chip enable signal is enabled.

8. The method of claim 7, wherein the first and second memory devices consume more current to generate an internal voltage in the weak active mode than in the standby mode; and wherein the first and second memory devices consume more current to generate the internal voltage in the strong active mode than in the weak active mode.

9. The method of claim 7, wherein the first and second memory devices generate the internal voltage with a higher drivability in the weak active mode than in the standby mode; and wherein the first and second memory devices generate the internal voltage with a higher drivability in the strong active mode than in the weak active mode.

10. The method of claim 7, wherein one of the first and second memory devices is selected according to a logical unit number (LUN) address.

* * * * *